(12) United States Patent
Mangon

(10) Patent No.: US 7,788,068 B2
(45) Date of Patent: Aug. 31, 2010

(54) TRANSFERRING LOAD INFORMATION AND RESULT INFORMATION BETWEEN ANALYSIS AND DESIGN SOFTWARE

(75) Inventor: Nicolas Mangon, Waltham, MA (US)

(73) Assignee: Autodesk, Inc., San Rafael, CA (US)

( * ) Notice: Subject to any disclaimer, the term of this patent is extended or adjusted under 35 U.S.C. 154(b) by 551 days.

(21) Appl. No.: 11/345,436

(22) Filed: Jan. 31, 2006

(65) Prior Publication Data

US 2007/0179759 A1    Aug. 2, 2007

(51) Int. Cl.
   *G06F 17/50*   (2006.01)
   *G06G 7/48*    (2006.01)
(52) U.S. Cl. .............................................. 703/1; 703/7
(58) Field of Classification Search ...................... 703/1, 703/6, 7
   See application file for complete search history.

(56) References Cited

U.S. PATENT DOCUMENTS

| | | | |
|---|---|---|---|
| 5,268,998 A | 12/1993 | Simpson |
| 5,444,836 A | 8/1995 | Hollingsworth et al. |
| 5,557,537 A | 9/1996 | Normann et al. |
| 5,856,828 A | 1/1999 | Letcher, Jr. |
| 5,923,573 A | 7/1999 | Hatanaka |
| 6,052,691 A | 4/2000 | Ardoin et al. |
| 6,426,745 B1 | 7/2002 | Isaacs et al. |
| 6,629,065 B1 | 9/2003 | Gadh et al. |
| 6,799,463 B2 | 10/2004 | Fields et al. |
| 6,816,819 B1 | 11/2004 | Loveland |
| 6,859,768 B1 | 2/2005 | Wakelam et al. |
| 7,162,706 B2 | 1/2007 | Kuang et al. |
| 7,246,044 B2 | 7/2007 | Imamura et al. |
| 7,292,908 B2 | 11/2007 | Borne et al. |
| 2001/0033281 A1 | 10/2001 | Yoshida et al. |
| 2003/0139907 A1 | 7/2003 | McCarthy |
| 2003/0200062 A1 | 10/2003 | Dessureault et al. |
| 2004/0153824 A1 | 8/2004 | Devarajan et al. |
| 2005/0038636 A1 | 2/2005 | Wakelam et al. |
| 2005/0071394 A1 | 3/2005 | Martyn et al. |
| 2005/0131924 A1 | 6/2005 | Jones |
| 2005/0209831 A1 | 9/2005 | Jungreis et al. |

(Continued)

FOREIGN PATENT DOCUMENTS

EP    1223520    7/2002

(Continued)

OTHER PUBLICATIONS

Ramon F. Sarraga, Modifying CAD/CAM surfaces according to displacements prescribed at a finite set of points, Computer-Aided Designvol. 36, Issue 4, , Feb. 2004, pp. 343-349.*

(Continued)

*Primary Examiner*—Paul L Rodriguez
*Assistant Examiner*—Luke Osborne
(74) *Attorney, Agent, or Firm*—Fish & Richardson P.C.

(57) ABSTRACT

Methods and apparatus, including computer program products, for receiving in a Computer Aided Design (CAD) tool result information and load information from a first analysis program, the result information determined by performing an analysis of a plurality of physical elements in a CAD model. And providing one or more of the result information or the load information from the CAD tool to a second analysis program.

20 Claims, 16 Drawing Sheets

U.S. PATENT DOCUMENTS

| | | |
|---|---|---|
| 2006/0119601 A1 | 6/2006 | Finlayson et al. |
| 2006/0143220 A1 | 6/2006 | Spencer, Jr. |
| 2006/0208169 A1 | 9/2006 | Breed et al. |
| 2006/0230351 A1 | 10/2006 | Stehle et al. |
| 2007/0063378 A1 | 3/2007 | O'Donoghue |
| 2007/0091119 A1 | 4/2007 | Jezyk et al. |
| 2007/0174026 A1 | 7/2007 | Mangon et al. |
| 2007/0174027 A1 | 7/2007 | Moiseyev |
| 2007/0179759 A1 | 8/2007 | Mangon |
| 2007/0179976 A1 | 8/2007 | Arvin et al. |
| 2007/0219764 A1 | 9/2007 | Backe |
| 2007/0282792 A1 | 12/2007 | Bailly et al. |
| 2008/0077364 A1 | 3/2008 | Wakelam et al. |

FOREIGN PATENT DOCUMENTS

| | | |
|---|---|---|
| WO | WO 02/08975 | 1/2002 |
| WO | WO 03/100555 | 12/2003 |

OTHER PUBLICATIONS

H. N. Gürsoy, Tetrahedral finite element mesh generation from NURBS solid models, Sep. 1, 1996, Engineering with computers, vol. 12, Issue—3, pp. 211-223.*

International Search Report for PCT Application No. PCT/US08/58746, dated Aug. 15, 2008.

U.S. Appl. No. 11/619,565, filed Jan. 3, 2007, Kfouri et al.

U.S. Appl. No. 11/460,524, filed Jul. 27, 2006, Kfouri et al.

U.S. Appl. No. 11/695,535, filed Apr. 2, 2007, Culver et al.

Autodesk, Inc., International Search Report and the Written Opinion of the International Searching Authority dated Aug. 31, 2007 for International Patent Application No. PCT/US2007/064009 filed Mar. 14, 2007.

ESS: "Klima2000 Handbuch—Schritt für Schritt (Excerpt: Kapitel 10)", Klima 2000, 1999, pp. 10-1 to 10-45.

Parametric Technology Corporation, "Getting Started with Pro/Engineer(R) 2001", 2001, Parametric Technology Corporation, pp. 1-192.

Autodesk Inc., Autocad Architectural Desktop (tm) User's Guide, 1999, Autodesk Inc., Release 2, pp. i-xxiv; 1-8; 219-296.

USPTO Non-Final Office Action in U.S. Appl. No. 11/341,229, mailed Dec. 24, 2008, 18 pages.

USPTO Final Office Action in U.S. Appl. No. 11/341,229, mailed May 14, 2009, 23 pages.

European Patent Office Examination Report for EP Application No. 07 758 552.9—2224, dated Sep. 17, 2009, 8 pages.

H.N. Gürsoy, "Tetrahedral Finite Elemente Mesh Generation from NURBS Solid Models," Engineering with Computers (1996), (12), pp. 211-223.

International Preliminary Report on Patentability for PCT Application No. PCT/US08/058746, dated Oct. 6, 2009, 6 pages.

Office Action dated Dec. 24, 2008 for U.S. Appl. No. 11/341,229, 20 pages.

Office Action dated May 14, 2009 for U.S. Appl. No. 11/341,229, 23 pages.

Ramon F. Sarraga, "Modifying CAD/CAM surfaces according to displacements prescribed at a finite set of points," Computer-Aided Design vol. 36, Issue 4, Feb. 2004, pp. 343-349.

Autodesk Inc., "AutoCAD Architectural Desktop (tm) User's Guide," 1999, Autodesk Inc., Release 2, pp. 1-xxiv; 1-8; 219-296.

* cited by examiner (a)

(b)

US 7,788,068 B2

TRANSFERRING LOAD INFORMATION AND RESULT INFORMATION BETWEEN ANALYSIS AND DESIGN SOFTWARE

BACKGROUND

Computer aided design (CAD) software is often used to prepare a CAD model or models representing a structure, such as a building. The CAD model can incorporate representations of physical elements, such as columns, beams, and the like that will be included in the structure. Drawings prepared from such a CAD model can be used in the actual physical construction of the corresponding structure. The CAD model may be prepared and edited by various individuals, including architects and structural engineers.

As part of a design stage or after a design is completed, a structural analysis is typically performed on a structure. Structural analysis can include the computation of deformations, deflections, or internal forces on and within solid and non-solid structures based on information such as a structure's geometry, applied loads and material properties of physical elements making up the structure. Result information incorporates results from performing the structural analysis and can incorporate, for example, displacements, axial forces, bending moments, shear forces, stresses, load reaction information, and other information. Result information can also incorporate a history of result information over time.

Load information incorporates a representation of one or more applied loads. An applied load is a force or forces applied to a component of a structure or to the structure as a whole. There are different types of applied loads. Commonly used applied loads can include constant loads known as dead loads (e.g., the weight of equipment, materials), static loads known as live loads which typically represent a one time maximum varying load on a structure (e.g., the weight of occupancy, automobile or foot traffic), loads proportional to exposed surface areas known as environmental loads (e.g., snow load, wind load, rain load), and dynamic loads. Dynamic loads typically involve dynamic effects such as from waves, ice flow, wind gusts, and earthquake motion. An applied load can be represented as a combination of different load types. Moreover, load information can represent a history of applied loads over time, such as might be caused by applying an earthquake ground motion to the foundation of a building.

Conventional analysis programs, tools, plugins or other suitable processes (hereinafter "programs") receive as input by way of import or user creation an analytical representation of a structure and, optionally, load information. Load information can be provided to an analysis program and/or derived by the analysis program. For example, often material dead loads—such as the weight of beams and columns, are automatically calculated by the analysis program, while environmental loads are input by the user. An analytical representation of a structure is different than a representation of the physical elements, e.g., columns, beams, etc. It is an idealized mathematical model that may represent only a portion of a building such as one wing or one floor or one frame of the building. For example, an analytical representation may be a wire frame representation of the physical elements, and the wire frame elements can include or have associated properties (e.g., weight, materials, moment of inertia, cross-sectional area), member connectivity and/or end conditions (e.g., pinned, free, fixed). Typically, the analytical representation is prepared separately and can be used for other types of analyses that are performed in the design stage.

The analytical representation can be subjected to applied load simulation and the like in an analysis program to identify, for example, stress levels in the various elements. See, e.g., FIGS. 12-16. On the basis of the analysis, elements may be modified (e.g., resized or other properties changed) and the modified analytical representation reanalyzed. A commonly used approach to performing structural analysis is the finite element approach which is a numerical method that models a structure as a discrete system with a finite number of elements interconnected at a finite number of nodes.

Depending on the structure and type of analyses required, multiple analysis programs commonly need to be used. For example, special foundation analysis programs may be used to analyze different foundation configurations or variations in soil properties. Additionally, there are other programs used to analyze specialized structures such as billboards or towers that are located on the tops of buildings. Results from one analysis are often iteratively used in another analysis. For example, the combination of wind and dead loads on a building can propagate through a structure and produce resultant loads on the foundation. Those loads may be used as input to a foundation analysis program. The results of the foundation analysis may have the consequence of changing the design (or the analytical model of the design), and the cycle of building and foundation analyses is commenced again.

Any change to the size or location (i.e., displacement) of physical members or their applied loading typically needs to be manually updated between the multiple analysis and design programs. For example, foundation reactions from a seismic analysis of the structure are commonly transcribed and used as input for a foundation analysis program. The effort and coordination involved with synchronizing these displacements and loadings between programs can be significant. Any out-of-synch issues could result in an inadequate design being taken to construction.

SUMMARY

This specification describes systems, techniques and computer programs for transferring load and result information between structural analysis and design programs.

In one general aspect, the techniques feature receiving in a CAD tool result information and load information from a first analysis program, the result information determined by performing an analysis of a plurality of physical elements in a CAD model. One or more of the result information or the load information is provided from the CAD tool to a second analysis program.

The invention can be implemented to include one or more of the following advantageous features. The CAD model is associated with the CAD tool. Incorporating one or more of the result information or the load information into the CAD model. The first analysis program or the second analysis program can be invoked. The load information incorporates a representation of one or more applied loads. The load information incorporates a history of applied loads over time. The result information incorporates one or more of: a displacements, an axial force, a bending moment, a shear force, a stress, or load reaction information. The result information incorporates a history of results over time.

In another general aspect, the techniques feature receiving in a CAD tool one or more displacements from a first analysis program, the one or more displacements based on performing an analysis of a plurality of physical elements in a CAD model, including applying one or more loads to the plurality of physical elements. One or more of the one or more displacements or one or more loads from the CAD tool is provided to a second analysis program.

The invention can be implemented to include one or more of the following advantageous features. The CAD model is associated with the CAD tool. The one or more displacements and the one or more loads are incorporated into the CAD model. One or more of: the first analysis program or the second analysis program are invoked. The one or more loads incorporates a history of applied loads over time. The one or more displacements incorporates a history of displacements over time.

Implementations of the invention can realize one or more of the following advantages. A physical representation, a corresponding analytical representation, load information, and result information can be integrated in a single CAD model. Each analysis program can use information in the CAD model, modify information in the CAD model, and add information to the CAD model. Results from an analysis by one analysis program can be easily provided to other analysis programs. Load and result information can be maintained and coordinated between multiple analysis and design programs. Various structural analysis programs can be used, and other types of analysis can be performed, including concrete design analysis, lateral load analysis, gravity load analysis, beam design analysis, steel design analysis, dynamic analysis, seismic analysis and steel connection design analysis.

The details of one or more implementations of the invention are set forth in the accompanying drawings and the description below. Other features, aspects, and advantages of the invention will be apparent from the description and drawings, and from the claims.

DESCRIPTION OF DRAWINGS

FIG. 6 shows a user interface displaying a plan view combining physical and analytical representations and illustrating a divergence there between.

Like reference symbols in the various drawings indicate like elements.

DETAILED DESCRIPTION

Figure 1:
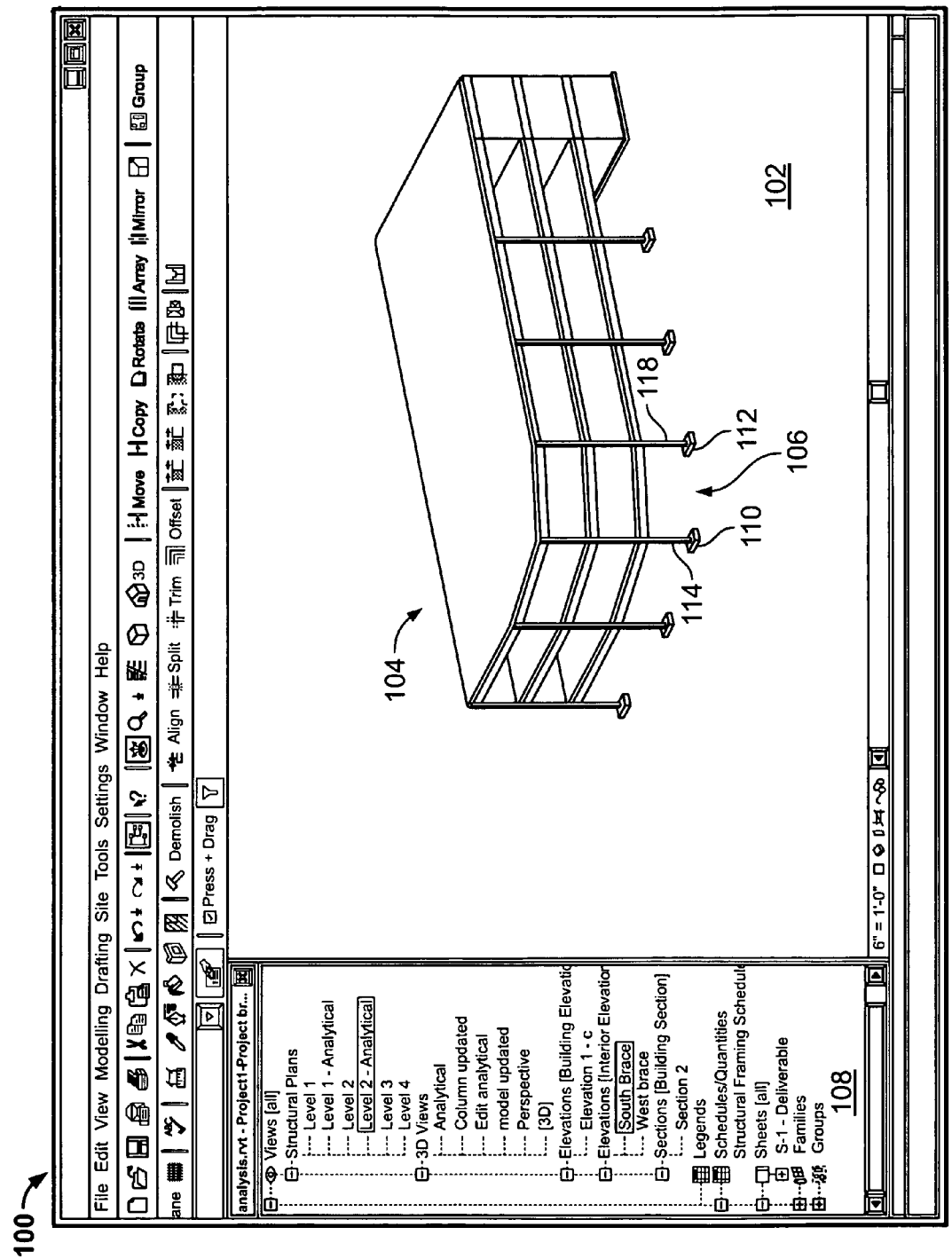
FIG. 1 shows a user interface for viewing and manipulating one or more computer aided design models.

FIG. 1 shows a user interface 100 for viewing and manipulating one or more CAD models. The user interface 100 can be presented by an interactive CAD program or tool that allows for the viewing, creating, and modifying of one or more CAD models. In one implementation, the CAD tool is Autodesk® Revit® Structure, available from Autodesk, Inc. of San Rafael, Calif. Generally speaking, a CAD model is one or more CAD models, or a view of one or more CAD models, or combinations of these. A CAD model can contain information required to represent one or more physical and analytical elements, and relationships between them, load information, and result information. For example, a CAD model can store one or more representations of a CAD model of a building. A CAD model can be stored in one or more files, object-oriented databases, relational databases, distributed objects, caches, data structures, combinations of these, or other suitable storage. The term "model" as used herein is synonymous with the CAD model's contents.

Although a graphical user interface (GUI) is illustrated, other user interfaces are possible, including user interfaces that allow for user interaction by means of sound, voice, gesture, eye movement, use of remote control devices, manually controlled devices, and combinations of these. The user interface can be provided on a number of computing devices including, but not limited to, devices such as a workstations, personal computers, cellular telephones, personal digital assistants, portable video playback devices, combinations of these, and other suitable devices. In one implementation, the user interface can be presented as one or more web pages. By way of illustration, the CAD tool can execute on one or more computing devices connected by one or more wired or wireless networks, shared memory, inter-processor networks, or other suitable means. A computing device can run a proprietary or commercially available multi-tasking operating system such as, without limitation, Microsoft Windows® XP (available from Microsoft Corp. of Redmond, Wash.), Linux (available from www.lixuxlinux.org), and Apple OS X (available from Apple Computer, Inc. of Cupertino, Calif.).

The user interface 100 illustrated in FIG. 1 can present one or more views of one or more models. A three dimensional (3D) view 102 presents a physical representation of a CAD model of a building. The view 102 can be used to create and modify the physical representation 104. The physical representation 104 depicts physical elements of the building represented by the CAD model including, without limitation, beams, braces, floors, slabs, columns, walls, and isolated and continuous footings. In one implementation and by way of illustration, the user interface 100 includes a view panel 108, which allows a user to select views and display one or multiple views in the user interface 100. The view panel 108 includes, but is not limited to, two dimensional (2D) and 3D views, plans, elevations, sectional views, analytical views, and combinations of these. View 102 shows a CAD model of a building section 106 having beams 114 and 118, and footings 110 and 112. Physical elements can be associated with attributes. In one implementation, physical element attributes include, without limitation, geometry, location, weight, cross sectional area, construction materials, reference to one or more corresponding analytical elements, and other suitable properties. Attribute values can be specified by the user or provided by default.

Figure 2:
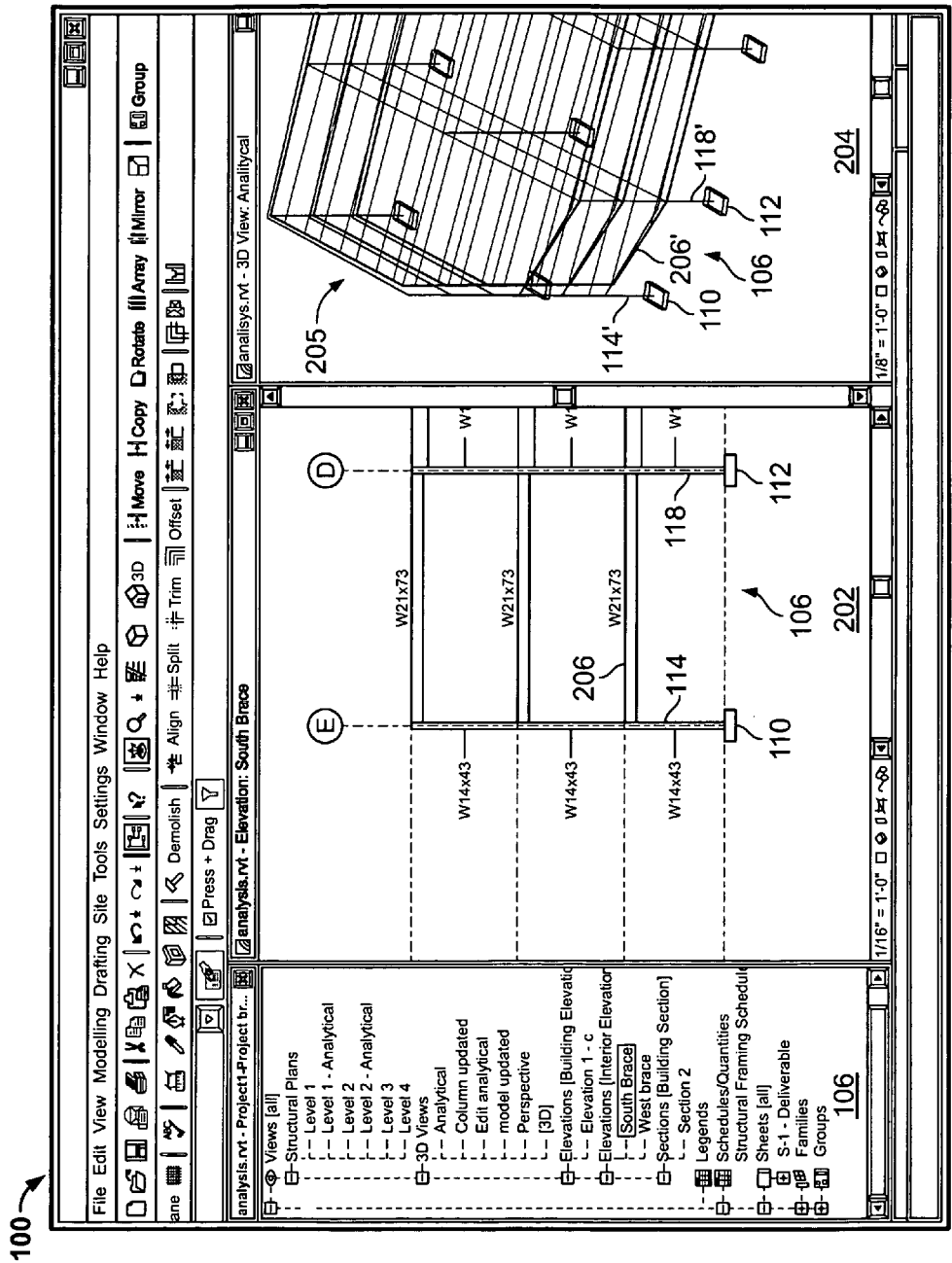
FIG. 2 shows a user interface displaying two views of a CAD model.

FIG. 2 illustrates additional views of the CAD model representing a building. A 3D view 204 showing an analytical representation 205 of section 106 is presented. The view 204 can be used to view and modify the analytical representation 205. The analytical representation 205 depicts analytical elements corresponding to the physical elements included in the physical representation 104. In one implementation, a given physical element may not have a corresponding analytical element. The analytical representation 205 can be generated automatically as the user creates or modifies physical elements. In one implementation, analytical elements are simplified versions of physical elements. For example, an analytical element can be a line or a planar surface. See Table 1. In a further implementation, an association between a given physical element in the physical representation 104 and one or more corresponding analytical elements in the analytical representation 205 can be established by, for example, including a reference to the one or more analytical elements in the physical element's attributes.

In one implementation, the analytical elements are automatically connected to one another to form a wire frame representation of the CAD model. In one implementation, a predetermined type of analytical element corresponds to a particular type or types of physical elements. Thus, when generating an analytical representation corresponding to the physical representation, analytical elements corresponding to physical elements can be created accordingly. In one implementation, an analytical element has a default position in relation to the analytical element's corresponding physical element(s). See Table 1. For example, a physical element representing a column has a corresponding analytical element that is a line that runs through the center of the column location.

TABLE 1

| PHYSICAL ELEMENT | ANALYTICAL ELEMENT | DEFAULT LOCATION OF ANALYTICAL ELEMENT |
| --- | --- | --- |
| Beam | Line | Parallel and centered on the top surface of the beam for floors and centered for trusses. |
| Brace | Line | Parallel through the center of the brace. |
| Column | Line | Parallel through the center of the column. |
| Wall | Planar Surface | Parallel through the center plane of the wall. |
| Floor/Slab | Planar Surface | Parallel on the top surface of floor/slab or in the mid plane of the floor/slab. |

As the analytical representation is generated in parallel with the physical representation, connections between physical elements cause connections to be made between analytical elements. In some instances, the location of an analytical element is deviated from the default location so that that the analytical element may connect to another analytical element. As a result, an analytical element may be partially coincident with, or incongruous to, a corresponding physical element. In one implementation, connections between analytical elements maintain coherence in the analytical representation. Coherence takes into account the probable location of finite element analysis nodes on analytical elements (e.g., for structural analysis) and guides connections between analytical elements to these locations. A node is a point at which different elements are joined together and where values of unknowns can be approximated. By way of illustration, if the analytical representation of a physical element representing a beam is attached at one end to the surface of a physical element representing a column, the corresponding analytical element representing the beam (which is a line centered on the top surface of the physical element representing the beam) will pass through the physical element representing the column to connect with the analytical element representing the column (which is a line located at the center of the column).

Default analytical element locations and coherence requirements can be described by rules or information which can be created and modified by the user or by an analysis program. In one implementation, coherence of the analytical representation is not a prerequisite to performing structural analysis of the CAD model. In one implementation, the default location and connectivity of an analytical element can be overridden by the user.

The analytical representation can include, without limitation, the following attributes: geometry, location, moments of inertia, sheer capacity, connectivity or end conditions (e.g., pinned, fixed, free), material properties, reference to one or more corresponding physical elements, and release conditions. Attribute values can be specified by a user or provided by default. In one implementation, default attribute values can be determined based on heuristics informed by, for example and without limitation, the user's past interaction with the CAD model, the materials and geometries of the physical elements, building codes, historical weather patterns for a given location, and the purpose of the structure (e.g., office, hospital, school, condominium, parking garage, etc.).

When an attribute of an analytical element is modified, the corresponding physical element can be adjusted to reflect the modification. In one implementation, when an analytical element attribute is changed, analytical elements that are connected to the analytical element are adjusted, if necessary to maintain coherency. For instance, if the user moved the location of an analytical element representing a horizontal beam, then analytical elements connected to the moved analytical element would be moved or resized accordingly, in order to maintain their coherent connection to the beam. In one implementation, changing the location or size of an analytical element does not change the location of the analytical element's corresponding physical element.

Referring again to FIG. 2, the analytical view 204 includes analytical elements representing columns (114', 118') and a beam 206' connecting the columns (114', 118'). A 2D elevation view 202 of the physical representation of the section 106 shows the corresponding physical elements 114, 118 and 206. Changes made to physical element attributes can be automatically reflected in corresponding analytical elements, and vice versa. In one implementation, changing the location of an analytical element does not cause the corresponding physical element to change its location. This allows a user to manipulate the analytical representation to capture eccentricities such as a torque or turning not manifest in the physical representation.

Figure 3:
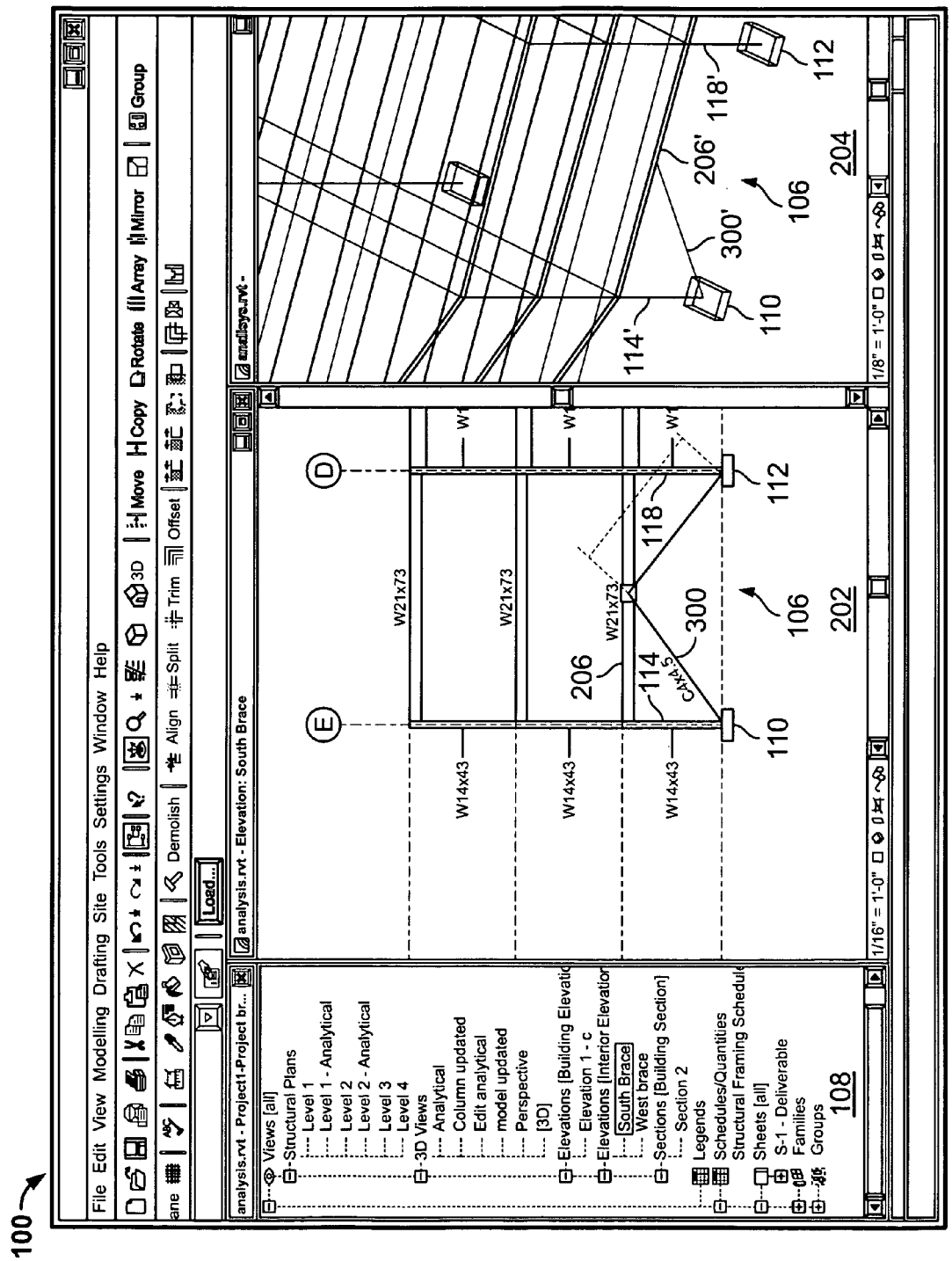
FIG. 3 shows a user interface displaying two views of a CAD model.
Figure 4:
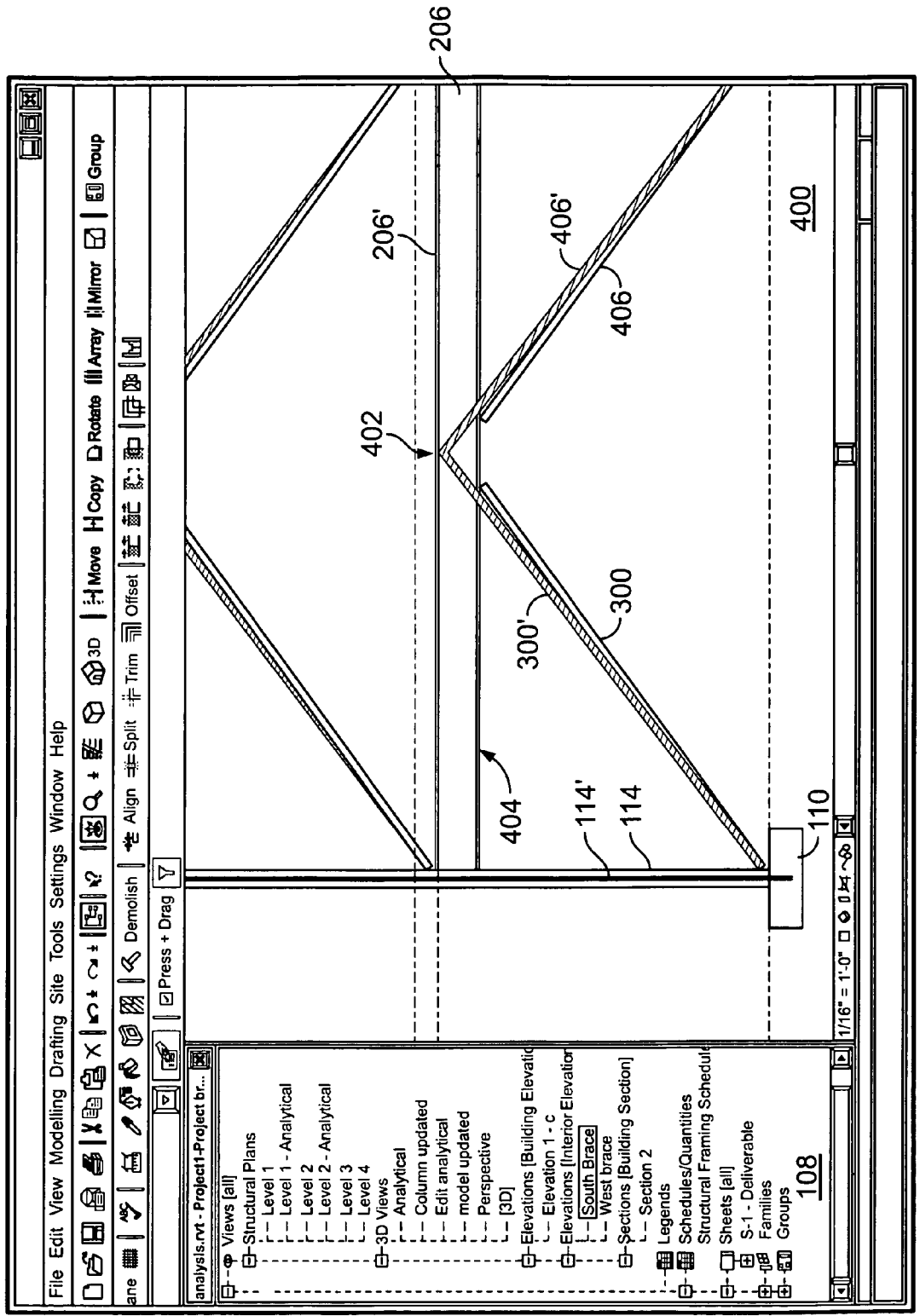
FIG. 4 shows a user interface displaying an elevation view combining physical and analytical representations.

FIG. 3 shows the section 106 shown in FIG. 2 after a physical element 300 representing a support brace has been added. In this illustration, addition of the physical element 300 (as shown in view 202) automatically causes the generation of a corresponding analytical element 300' shown in view 204. The analytical representation is automatically maintained as the user creates, modifies, or deletes physical elements. For example, if the user moves or deletes the physical element 300, the counterpart element 300' is automatically moved or deleted. In one implementation and by way of further illustration, if the user moves or deletes the analytical element 300', the counterpart physical element 300 is not moved or deleted. (In one implementation the user can manipulate the analytical representation and defeat coherence.) As illustrated in FIG. 4, the default location of the analytical element 300' is not required to be entirely coincident with the physical element 300, in order to achieve coherence in the analytical representation.

FIG. 4 shows an elevation view 400 that combines physical and analytical representations. In this illustration, a physical element 406 representing a brace 406 has been added to section 106. Each physical element (206, 300, 406, 114) has a corresponding analytical element (206', 300', 406', 114') that was automatically generated. Notice that the analytical element 114' representing a column is parallel to and coincident with the center of the physical element 114 representing the column. The analytical element 206' representing the beam is coincident with the top surface of the physical beam 206. In one implementation, analytical elements representing physical beams, floors and slabs are coincident with the top surfaces of the corresponding physical elements based on the assumption that top surfaces are where finite element analysis nodes are located for structural analysis purposes. Notice however that the analytical elements 300' and 406' representing braces are not coincident with the top surfaces of the corresponding physical elements 300 and 406. In one implementation, coherence requires the analytical elements connect with the analytical element 206' representing the beam at the center point 402 of the analytical element 206' representing the bean. This would not be the case if the analytical elements 300' and 406' representing the cross beams were entirely coincident with their corresponding physical elements. In one implementation the user can manipulate the analytical representation and defeat coherence.

Figure 5:
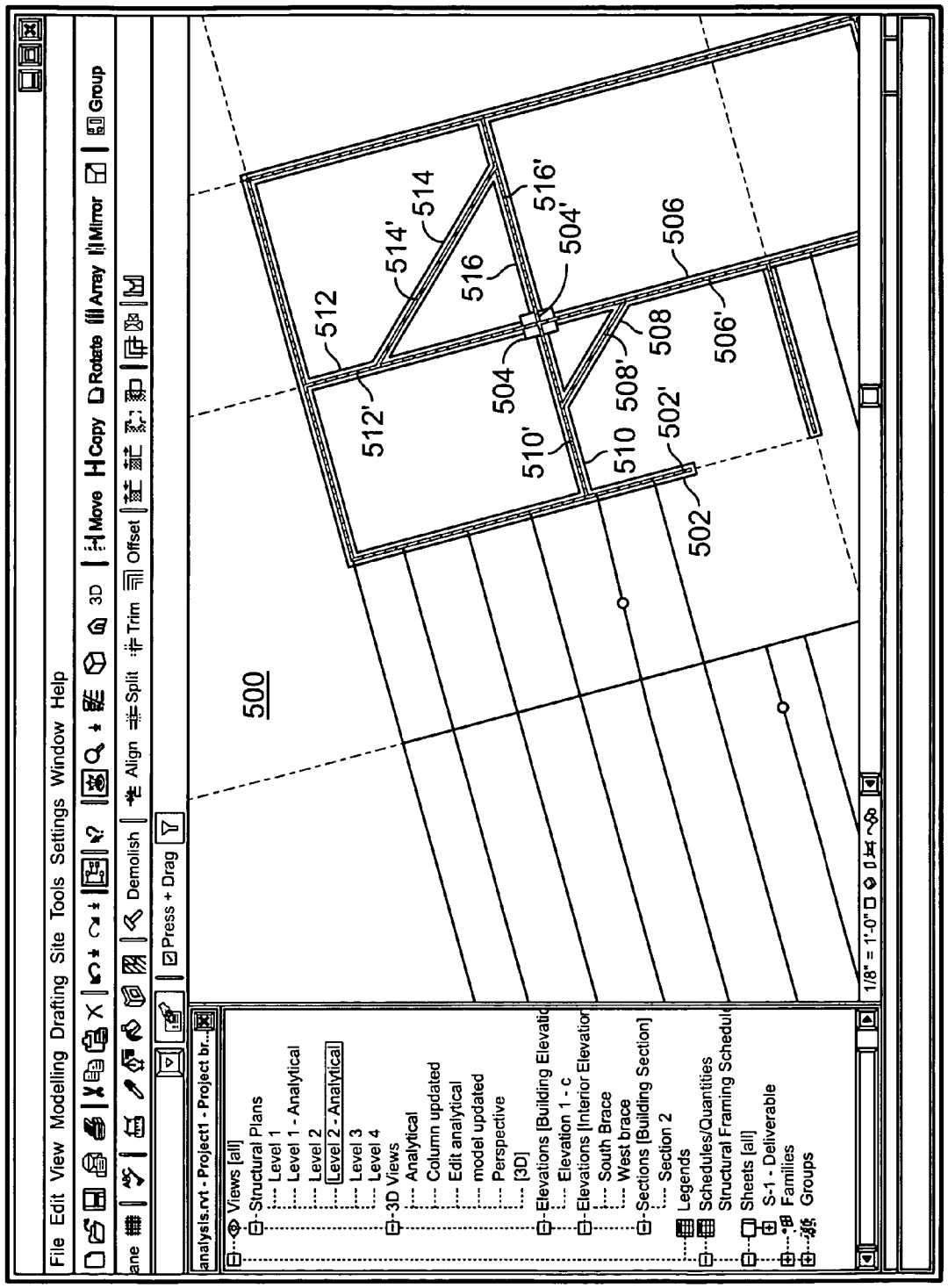
FIG. 5 shows a user interface displaying a plan view combining physical and analytical representations.

FIG. 5 shows a plan view 500 that combines physical and analytical representations. The physical element 504 representing a column has a corresponding analytical element 504', which is represented by the center point of the element 504 representing the column. In an elevation view of the element 504 representing the column, the analytical element 504' representing the column would appear as a vertical line running through the center of the column. Physical elements 506, 510, 512 and 516 representing beams all abut the physical element 504 representing the column. However, the analytical elements 506', 510', 512' and 516' representing the beams extend into the physical element 504 representing the column to connect with the analytical element 504' representing the column in order to create a coherent representation. The element 508 is a secondary beam supported by the two primary beams 510 and 506. The analytical element 508' representing the secondary beam lies on the top surface of the physical element 508 representing the secondary beam and connects to analytical elements 510' and 506' representing the primary beams at either end. Likewise, element 514 representing the secondary beam supported by the two primary beams 512 and 516. The analytical element 514' representing the secondary beam lies on the top surface of the physical element 514 and connects to analytical elements 512' and 516' representing the primary beams at either end. The physical element 510 representing a beam abuts physical element 502 representing a wall. The analytical element 510' representing the beam connects to the analytical element '502 representing the wall plane which lies in the center of the element 502 representing the wall.

Figure 6:
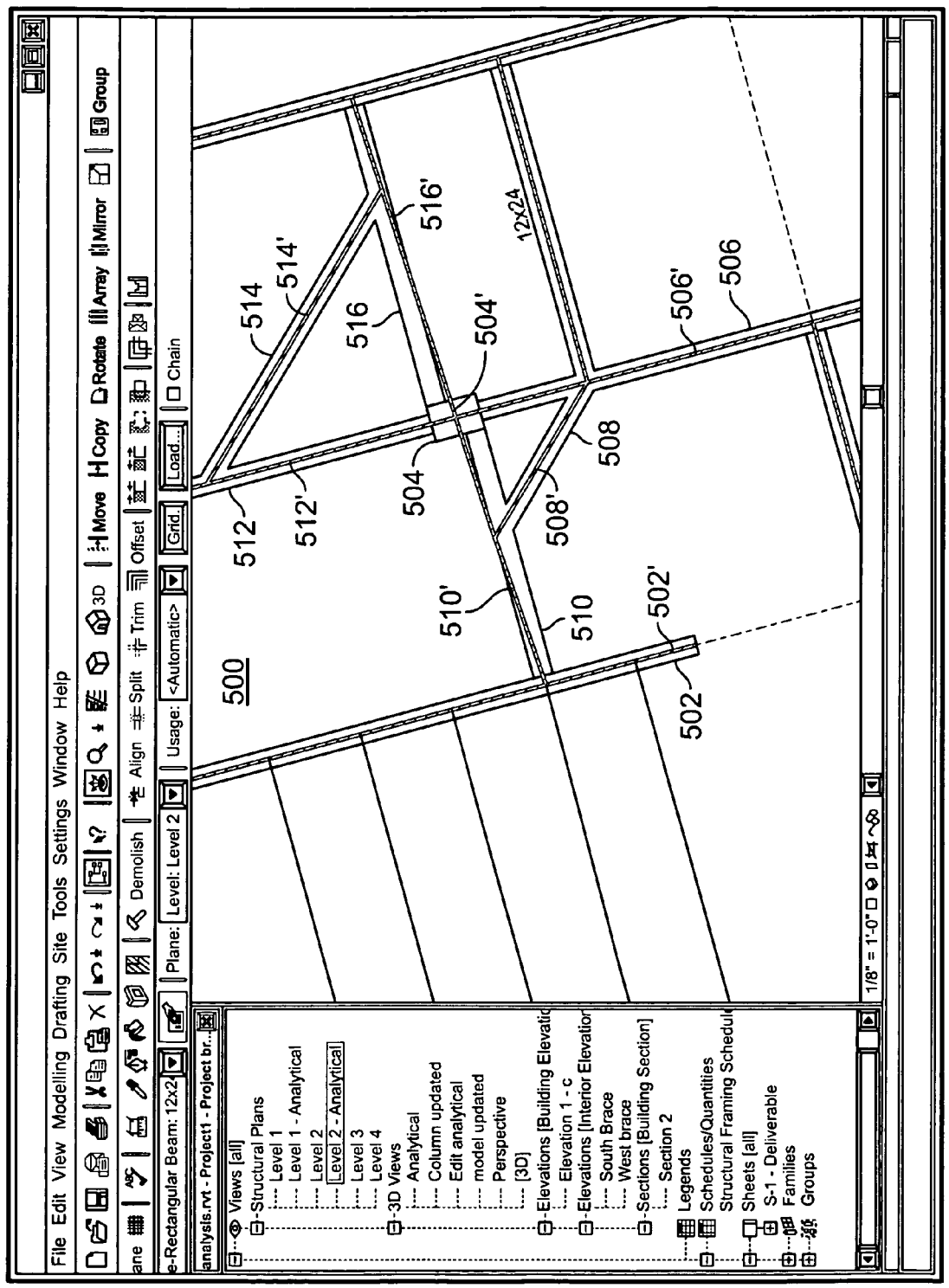

FIG. 6 illustrates divergence of an analytical representation from a physical representation. As presented in view 500, physical elements 516 and 510 representing the beams have been moved to place them off center from physical element 504 representing the column. Notice, however, that the corresponding analytical elements 510' and 516' have by default remained connected to the analytical element 504' representing the column even though the analytical elements 510' and 516' are no longer coincident with their corresponding physical elements 510 and 516 representing the beams. This is to preserve the coherence of the analytical representation. However, as discussed above, the user can override the default configuration of the analytical representation.

Figure 7:
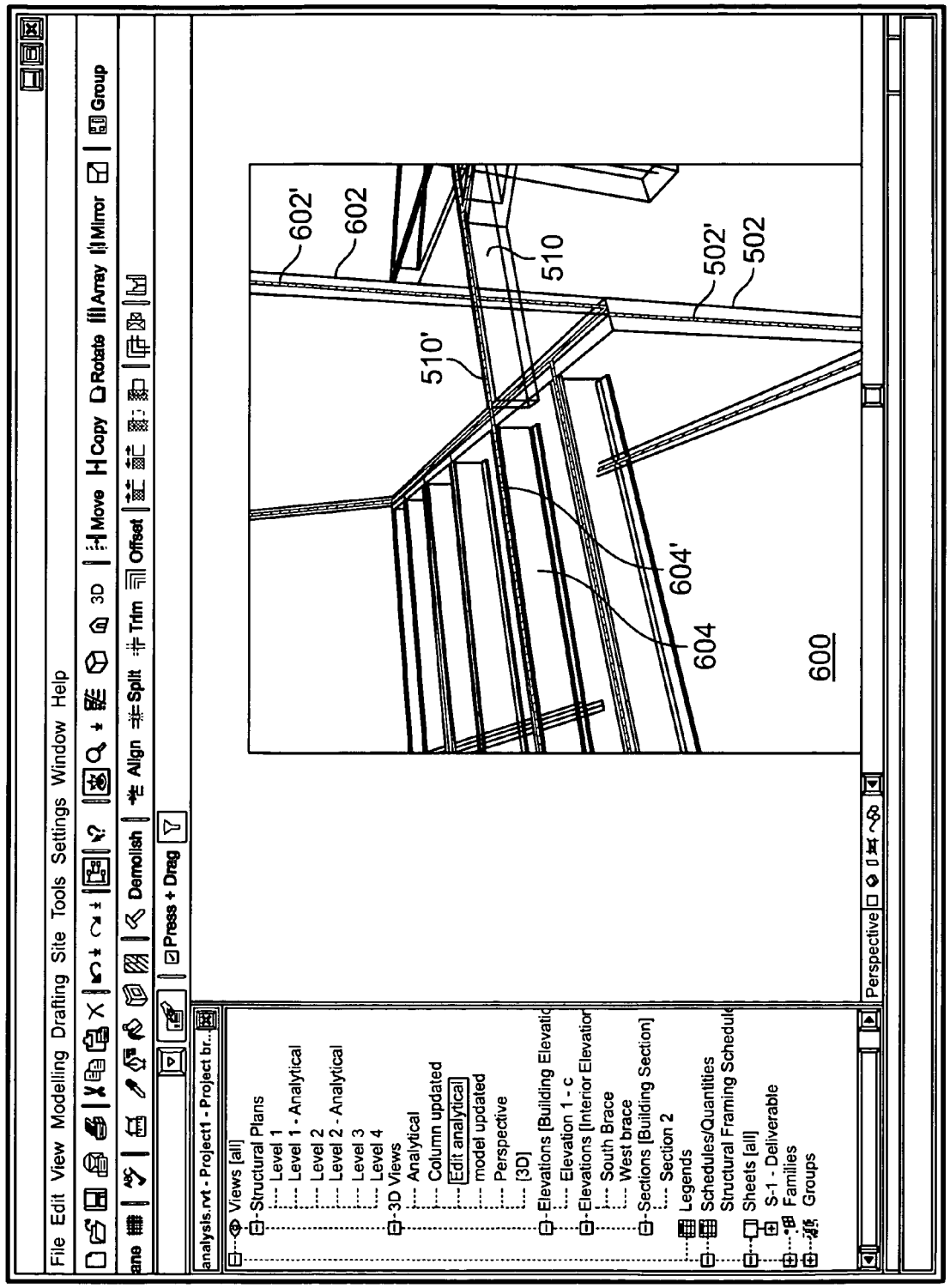
FIG. 7 shows a user interface displaying a 3D view combining physical and analytical representations of a CAD model.
Figure 8:
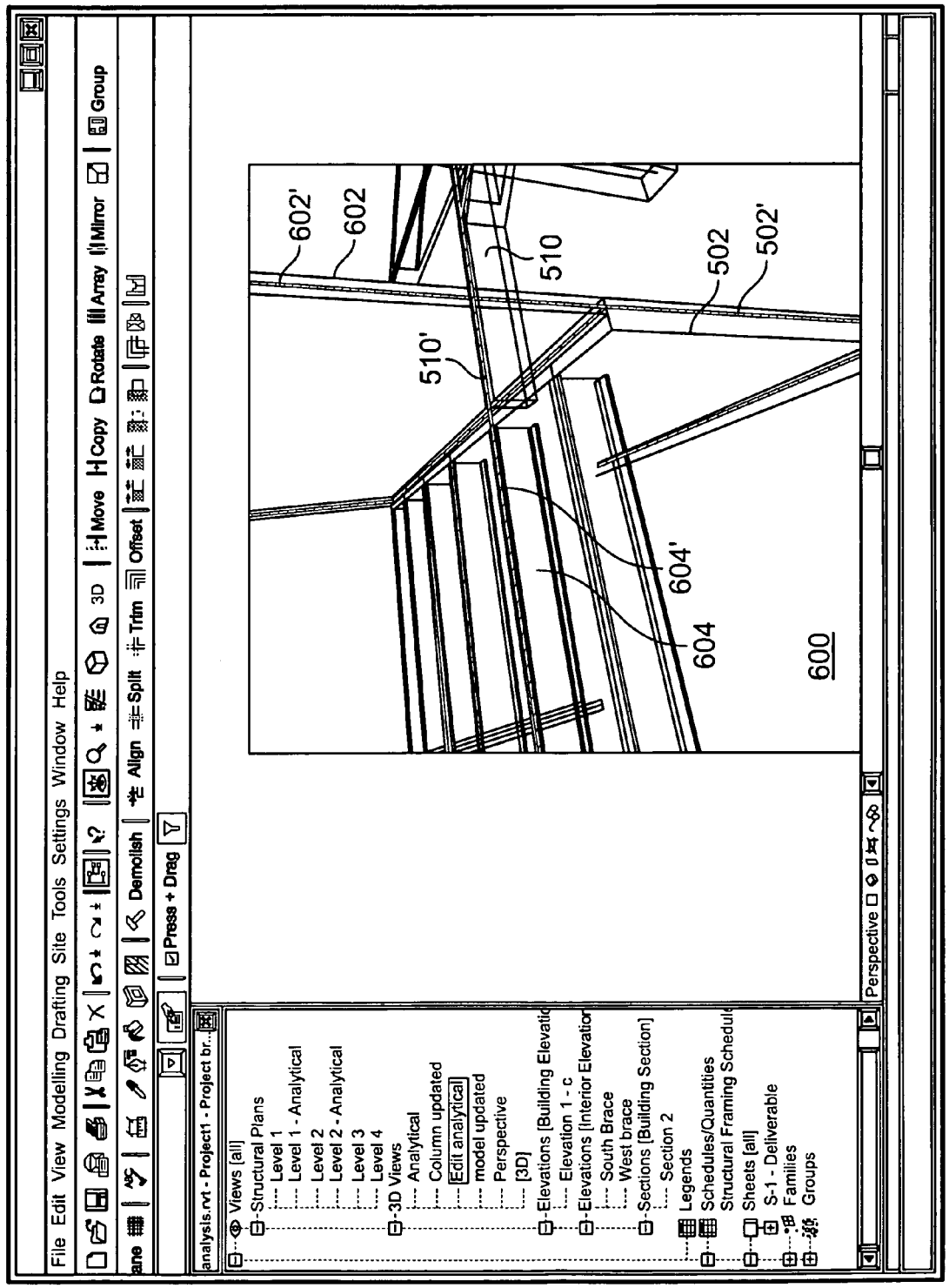
FIG. 8 shows a user interface displaying a 3D view combining physical and analytical representations of a CAD model.

FIG. 7 shows a 3D view that combines physical and analytical representations of two walls. Physical element 510 representing a beam abuts physical element 502 representing a lower wall while the corresponding analytical element 510' representing the beam connects to the analytical element 604' corresponding to a physical element 604 representing the beam on the other side of the physical element 502 representing the wall. Physical element 602 representing an upper wall is supported by physical element 502 representing the lower wall. Although the surfaces of the elements 502 and 602 representing the walls lie in the same plane on one side, the surfaces on the other side do not since the element 502 representing the lower wall is thicker than the element 602 representing the upper wall. The analytical model for walls 502 and 602 is a surface and the default location is the center plane of the wall. The analytical elements for the element 602 representing the upper wall and the element 502 representing the lower wall do not lie in the same plane. From a structural analysis standpoint, this means that the upper wall is not supported by the lower wall. In one implementation, one of the upper 602' or lower 502' analytical wall elements is automatically moved to be in line with the other. In other implementation, the user can manually move one or both of the analytical elements 602' and 502' so they lie in the same plane. The decision can be based on engineering judgment. View 600 in FIG. 8 shows the analytical wall elements 602' and 502' in alignment as a result of moving the analytical wall element 502'. Notice how the physical wall elements 502 did not change location.

Figure 9:
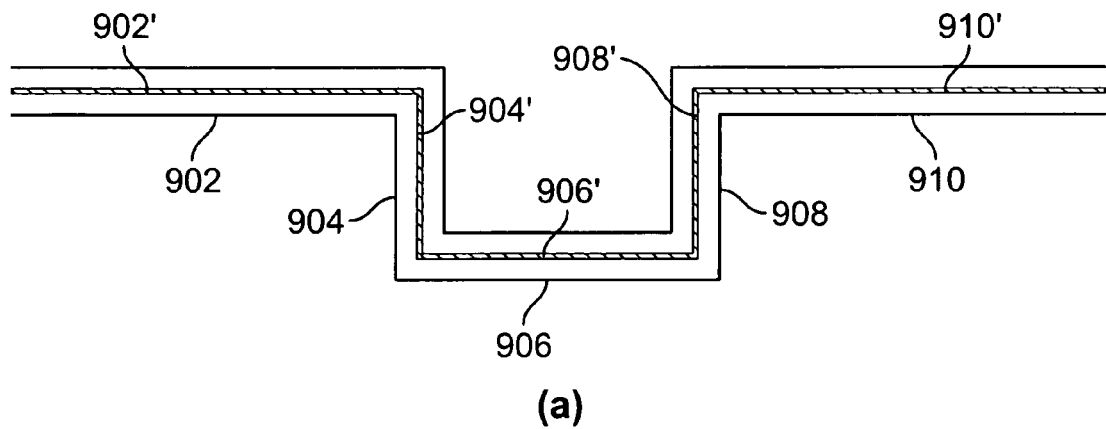
FIG. 9 is a schematic representation illustrating an override as a default analytical representation.
Figure 9:
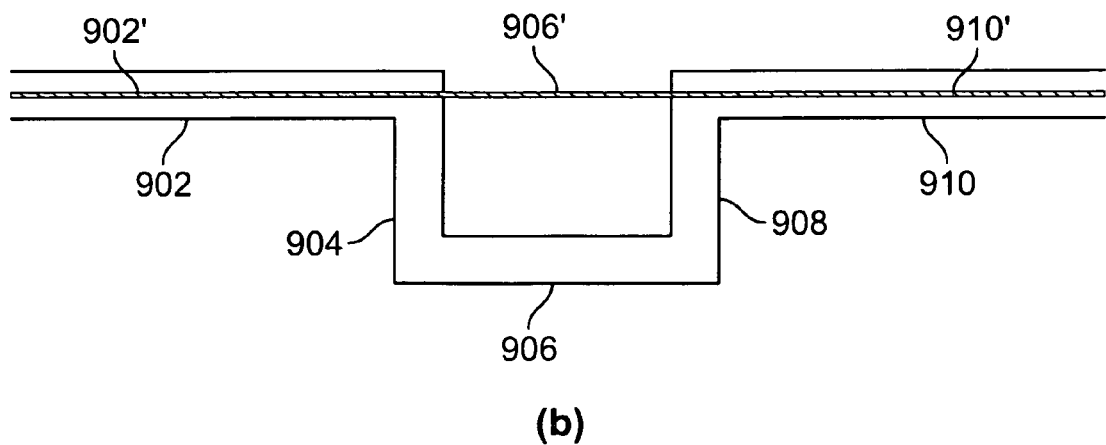

FIG. 9 presents another example of overriding the default analytical representation. In part (a) of FIG. 9, a wall consisting of five physical wall elements (902, 904, 906, 908, 910) is shown along with the wall's corresponding default analytical representation consisting of analytical wall elements (902', 904', 906', 908', 910'). In part (b) of FIG. 9, a user has decided not to have an analytical model for wall elements 904' and 908', and projected analytical wall element '906 to be in alignment with elements '902 and '910.

Figure 10:
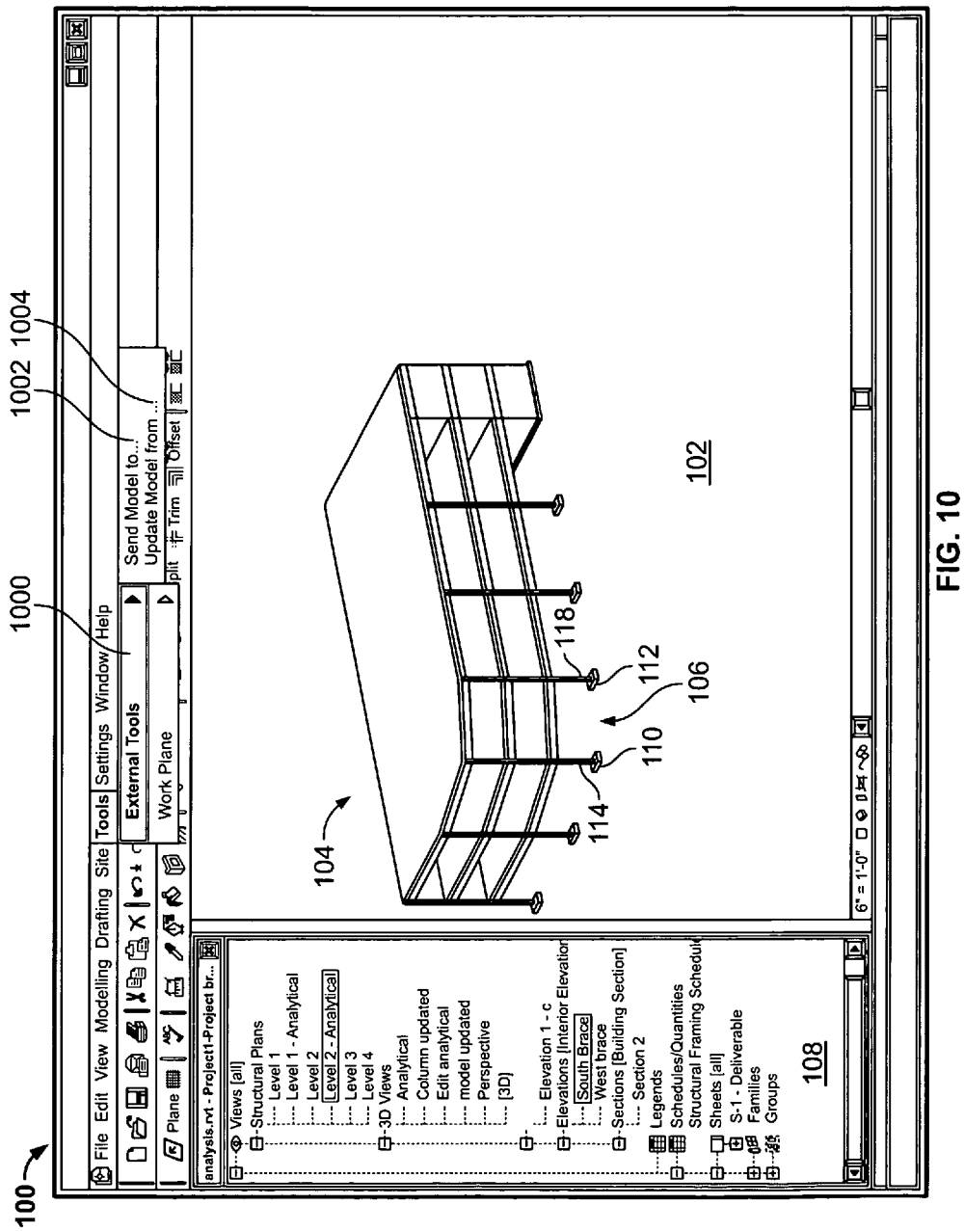
FIG. 10 shows a user interface for exchanging information between analysis programs.
Figure 11:
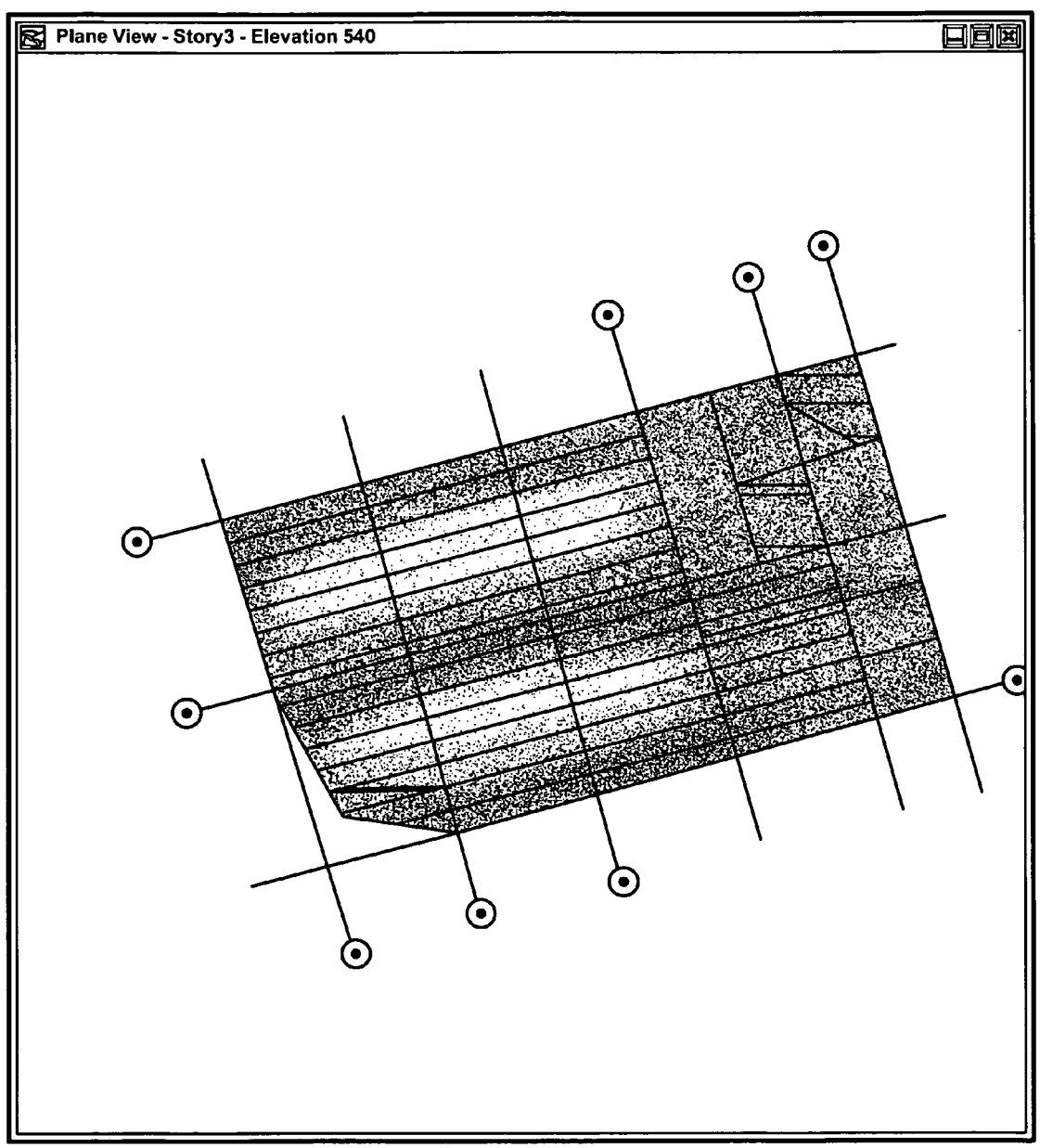
FIG. 11 is an example of an analysis program user interface.

In one implementation, structural analysis of a CAD model (or portions thereof) can be initiated from the CAD tool, as shown in FIG. 10. Users can select an analysis program to invoke, for example, by selecting the "Tools/External Tools" 1000 menu item in the user interface 100, and then selecting the "Send Model to . . . " menu item 1002. This selection causes a list identifying one or more analysis programs to be presented from which the user can chose a desired program. This analysis program is then invoked (if it is not already running) and CAD model information (e.g., a physical representation, an analytical representation, and analytical information) is transferred to the analysis program. The analysis program can optionally present its own user interface (e.g., 1100 in FIG. 1) in combination with the user interface 100 or by itself.

In one implementation, after the analysis program has completed its function, or while it is performing its function, the analysis program can then update the CAD model with changes to element properties and analysis information (i.e., load information and/or result information). This integrated model capability allows analysis programs to share information and build on the results of earlier invoked analysis programs.

Users have the option of selecting a number of physical or analytical elements before invoking an analysis program. In which case, the program can either perform its analysis on the selected elements or give users the option to perform analysis on the full model. An analysis program can also provide users with the ability to select which element types are to be analyzed.

The analysis program can optionally prompt users to provide additional input that is not available in the transferred CAD model information, such as by presenting a dialog box whereby a user can specify the information or the information's location. Users can optionally also select which elements whose properties are modified by the analysis program are to be automatically updated in the CAD model. For example, the analysis program might change the thickness and position of columns in a physical representation.

In another implementation, the analysis program does not have to persist its results in the CAD model. Instead, an analysis program might store results in its own database or CAD model. Users can import such information into the CAD model using the "Update Model from . . . " menu item 1204.

Figure 12:
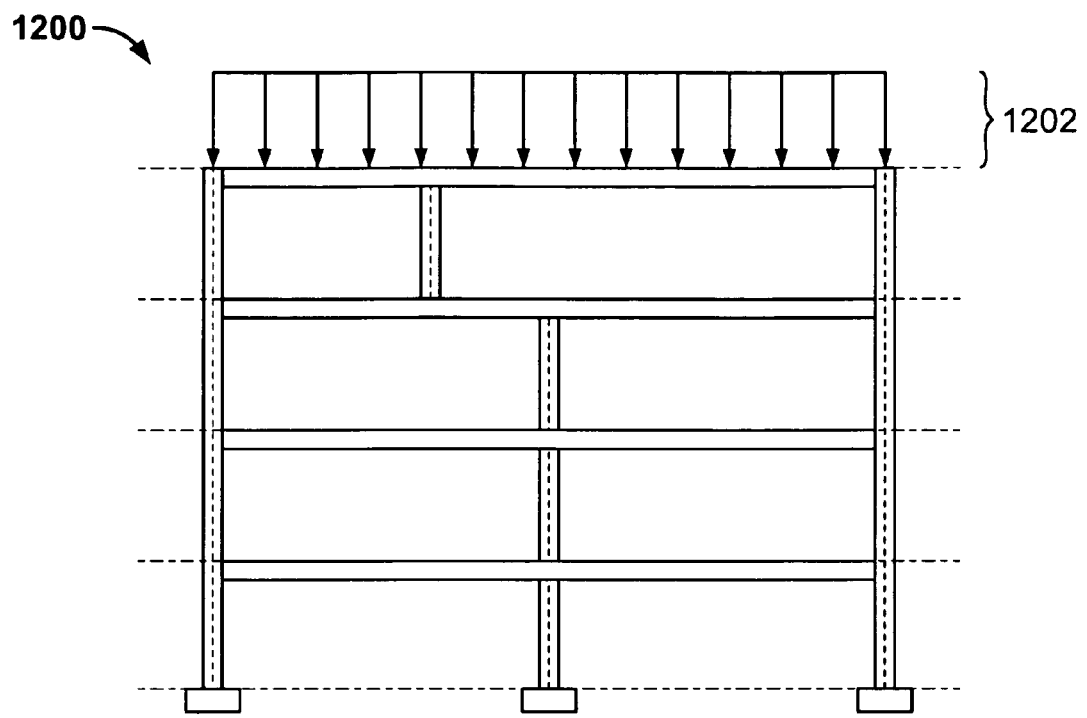
FIGS. 12-16 illustrate how external loads can be propagated through a structure by an analysis program.

FIGS. 12-16 illustrate how external loads can be propagated through a structure by an analysis program. FIG. 12 is an elevation view 1200 of a building where an external distributed load that represents live loads is applied, as depicted by the downward pointing arrows 1202.

Figure 13:
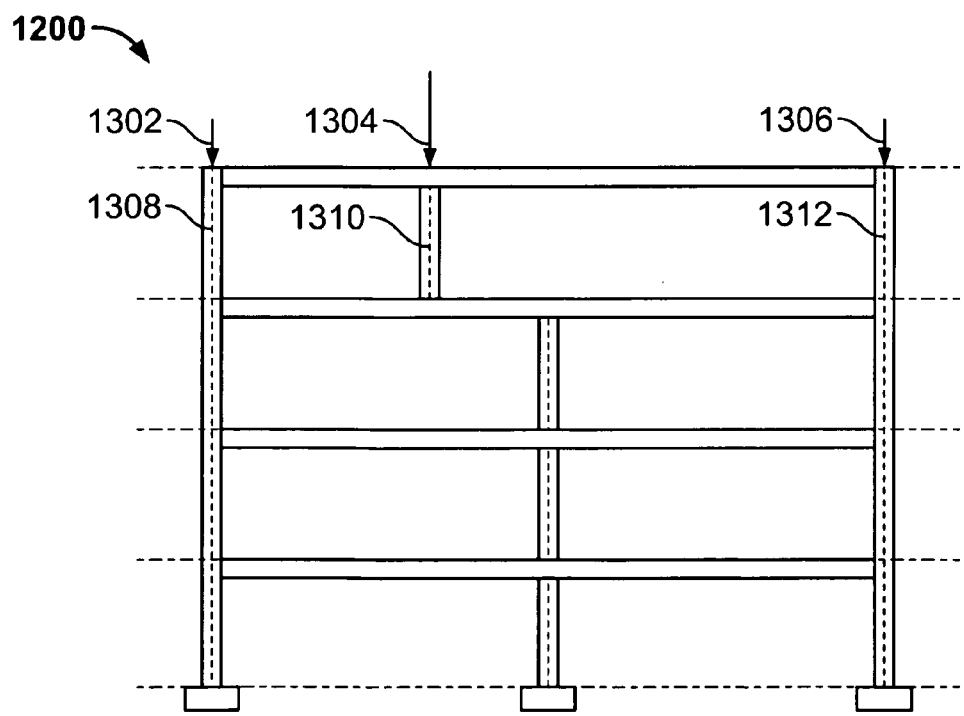

FIG. 13 shows the external load 1202 being distributed by the analysis program to create three load reactions: 1302, 1304 and 1306. The magnitude of the reactions is different based on the span length and the stiffness of beams and columns. These reactions become loads applied on the supporting columns 1308, 1310 and 1312, respectively.

Figure 14:
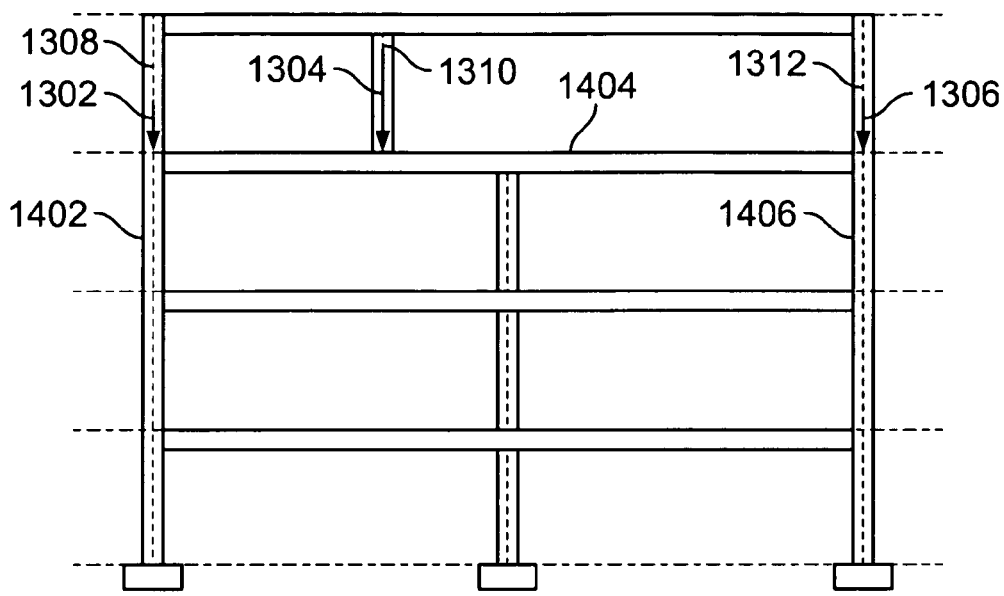

FIG. 14 illustrates that the load reactions 1302, 1304 and 1306 have been transferred by the columns 1308, 1310 and 1312 to members underneath, which are the columns on the left 1402, the right 1406 and a beam 1404 in the center.

Figure 15:
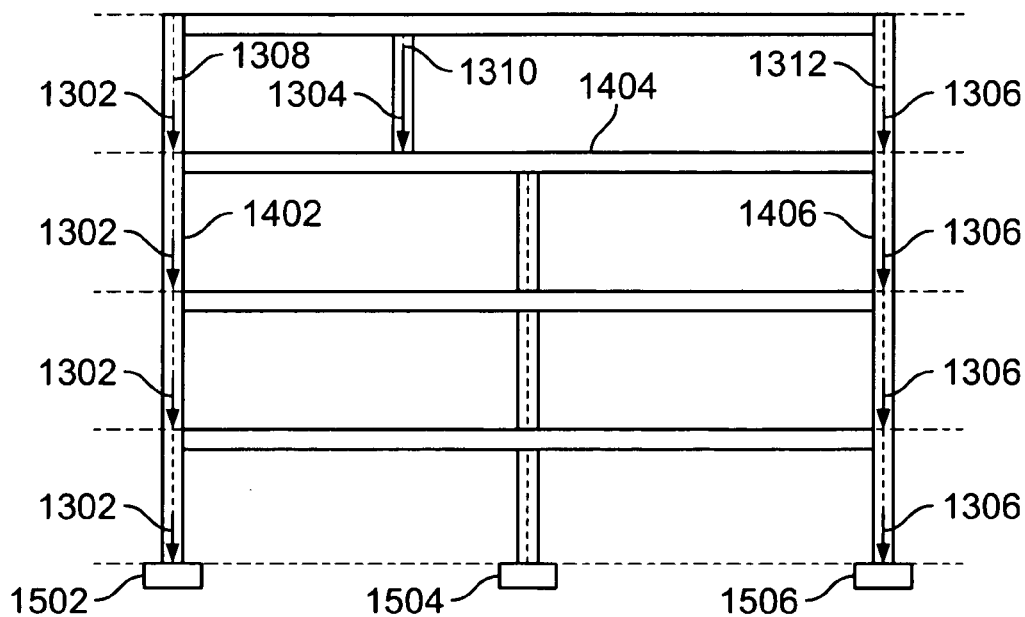

FIG. 15 illustrates left and right load reactions (1302 and 1306) propagating directly down to the foundations 1502 and 1504, respectively.

Figure 16:
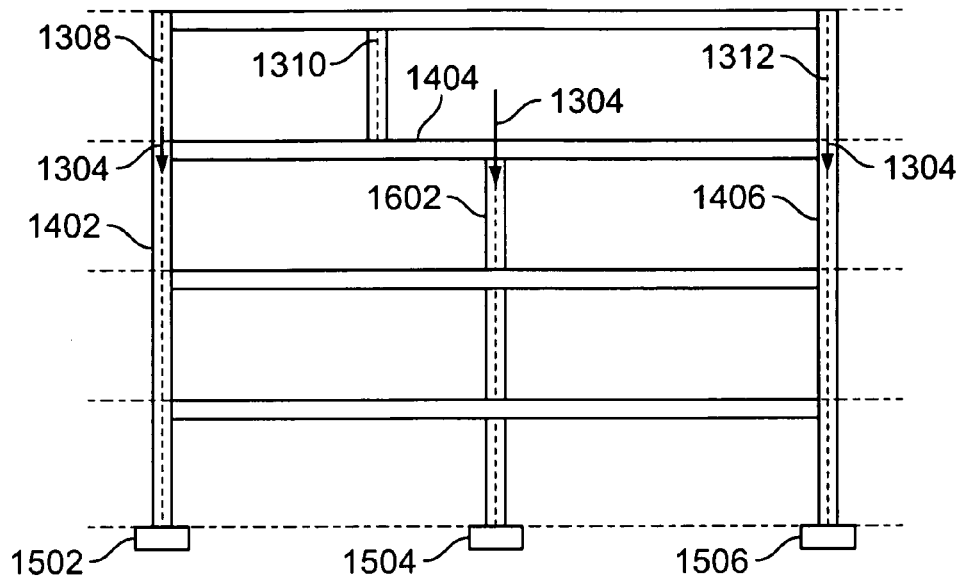

Finally, FIG. 16. illustrates the central load reaction 1304 being distributed again between the columns 1402, 1602 and 1406 that support the beam 1404. The load reactions 1304 will propagate to the foundation as before and the analysis program can accumulate all of the loads that are applied to any member so that for the foundations 1502, 1504 and 1506 a total load can be the sum of the distribution of all the reactions in the structure.

Load information and/or result information that are determined by the analysis program can be provided to the CAD tool. By way of illustration, if a user wants to design a foundation (e.g., calculate the size of the foundation and the reinforcement inside), the user can use another analysis program, perhaps from a different software publisher, that will extract the foundation information and load reactions calculated by the first analysis program. The user does not have to manually transfer the output of the first analysis program to the second analysis program. This is done automatically. As such, time is saved and errors that could result from manual manipulation of the data are avoided.

Figure 17:
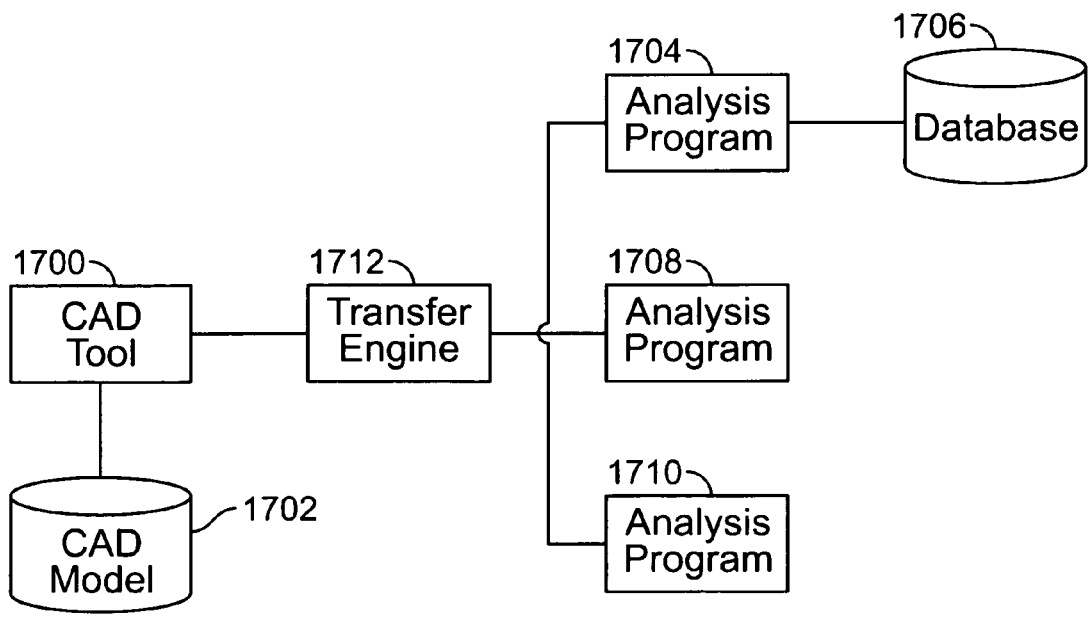
FIG. 17 is a detailed system diagram of a CAD tool.

FIG. 17 is a system diagram of CAD tool 1700 and various analysis programs 1704, 1708, and 1710. In one implementation, commercially available analysis programs can be used to perform the analysis. The analysis programs 1704, 1708, and 1710 can be tightly integrated with the CAD tool 1700 (e.g., as a plug-in module or dynamic link library) or loosely integrated (e.g., requiring export of the CAD model information to another process or persistent storage). As examples, the following commercially available analysis programs can be used: ETABS, available from Computers and Structures, Inc. of Berkeley, Calif.; RISA-3D, available from RISA Technologies of Foothill Ranch, Calif.; or ROBOT Millennium available from RoboBAT/ISS Inc. Other types of analysis programs can be integrated with the CAD tool 1700 including, but not limited to, concrete design analysis, lateral load analysis, gravity load analysis, beam design analysis, steel design analysis, dynamic analysis, seismic analysis and steel connection design analysis.

When the user invokes an analysis program 1704, 1708, or 1710 from the CAD tool 1700, the CAD tool 1700 can transfer CAD model 1702 information to the selected analysis program by way of a transfer engine 1712. Alternatively, the analysis program can access the CAD model 1702 itself by way of transfer engine 1712 and obtain the information needed to perform the analysis. As analysis is being performed, or during analysis, analysis results are transferred to the CAD model by way of transfer engine 1712 as initiated by the invoked analysis program or by the CAD tool 1700. In one implementation, transfer engine 1712 is a programming interface or protocol incorporating functionality for transferring information between the CAD tool 1700 and one or multiple analysis programs. The analysis programs and the CAD tool can execute on the same computing device, or on different computing devices connected by one or more shared or private computer networks, shared memory, combinations of these, or other suitable means.

An analysis program can maintain a concurrent database 1706 which can be used to store information that users can add or modify inside the analysis application. In one implementation, every element in the CAD model 1702 has a unique element identifier (ID). This ID can be used by the analysis program to correlate data in the CAD model 1702 with data in the database 1706. A synchronization process may be required to insure that when the analysis application is invoked that data in the database 1706 accurately reflects the data in the CAD model 1702. For example the user may have added, removed or changed elements in the CAD model 1702.

Figure 18:
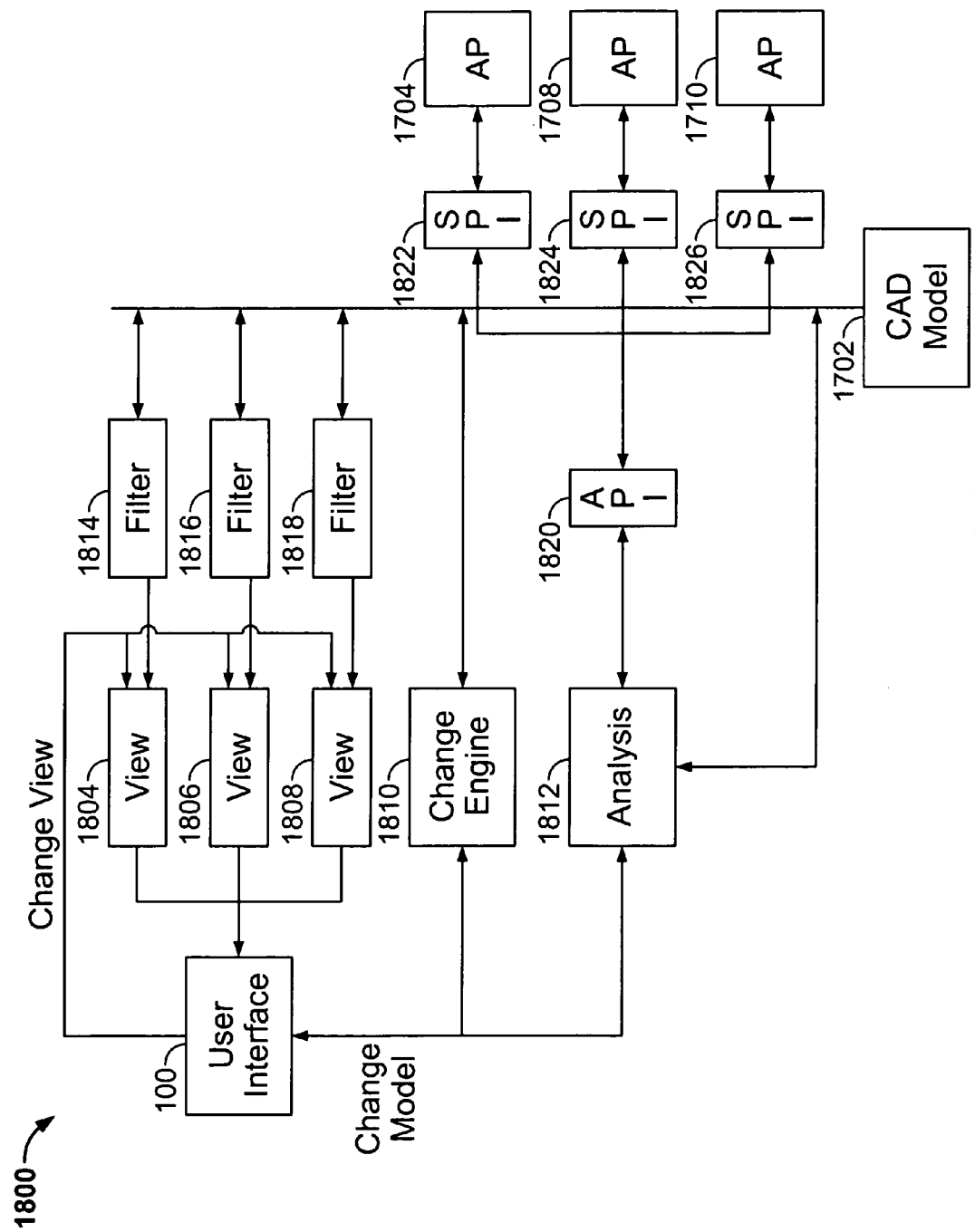
FIG. 18 is a flow diagram illustrating transference of information between analysis programs and a CAD tool.

FIG. 18 shows a system 1800 for exchanging information between one or more analysis programs (1704, 1708, 1710) with the CAD model 1702. The user interface 100 provides one or more views (1804, 1806, 1808) of the CAD model 1702. Generally speaking, a view (1804, 1806, 1808) can present n-dimensions (e.g., 2D, 3D) of information pertaining to the CAD model 1702. Views can, for example, be scaled, rotated and translated. A view can optionally present an altered version of the CAD model by applying one or more filters (1814, 1816, 1818) to the CAD model 1702. A filter can screen out certain types of information that are of no interest to a given view. For example, a physical view can use a filter to screen out analytical representations of physical elements, whereas a purely analytical view can use a filter to screen out physical elements. Alternatively, a filter can interact with elements in the CAD model 1702 in order to obtain specific representations of the element. For example, an element could render itself as a solid, physical object, as an analytical representation of the physical object, or both.

In one implementation, the user interface 100 propagates information pertaining to changes the user makes to the CAD model 1702 through one or more views (1804, 1806, 1808) to a change engine 1810. The change engine 1810 accepts this information and uses it to maintain synchronization between the analytical representation and the physical representation of the CAD model 1702. For example, if a user moves a physical element, the change engine 1810 moves the corresponding analytical element(s) (as necessary) to maintain coherence in the analytical representation. Likewise, changes to attributes made in one representation are reflected in the other by the change engine 1810. The change engine 1810 generates the analytical representation as the user interactively generates or edits the physical representation.

Analysis of a physical or analytical representation in the CAD model 1702 can be initiated by the analysis component 1812. In one implementation, the analysis component 1812 invokes one or more analysis programs (1704, 1708, 1710) as a result of selection of menu item 1002 in user interface 100, for example. An analysis program can be invoked through an application programming interface (API) 1820. The API 1820 communicates with an analysis program (1704, 1708, 1710) through a service provider interface (SPI), such as 1822, 1824 and 1826. In one implementation, each analysis program (1704, 1708, 1710) implements the SPI. The API 1820 and the SPIs (1822, 1824, 1826) can implement a communication protocol that exchanges information using memory buffers, shared memory, dynamically linked libraries, network communication mechanisms, or other suitable means including more than one of these.

In one implementation, an API and an SPI are instantiations of objects. An API object's methods invoke an SPI object's methods (or vice versa) in order to transfer model information and perform analysis. For example, an analysis program may need to obtain CAD model 1702 information or otherwise convert CAD model 1702 information into a format suitable for analysis. In a further implementation, the API 1820 can cause an analysis program to present a GUI through which the user can monitor and control the analysis. In another implementation, an analysis program can read and write information to the CAD model 1702 (e.g., through an SPI or other suitable means).

The analysis program, or the user of the analysis program, can change attributes of both physical and analytical elements in the CAD model 1702. For example, the size of elements can be increased to accommodate loads. In one implementation, physical and analytical element attributes can be recognized by the structural analysis programs (1704, 1708, 1710). These changes to element attributes and/or analysis information are, in one implementation, automatically incorporated into the CAD model 1702 directly or indirectly (e.g., by importing information from an analysis program) thereby making the changes immediately available for viewing in the user interface 100. In this way, multiple analysis programs can share information.

The system 1800 may have fewer or more components than those illustrated in FIG. 18. A given component can execute on one or more communicably coupled computing devices. For instance, computing devices can be connected by a wired network, a wireless network, the Internet, shared memory, an inter-processor communication channel, or combinations of these.

Figure 19:
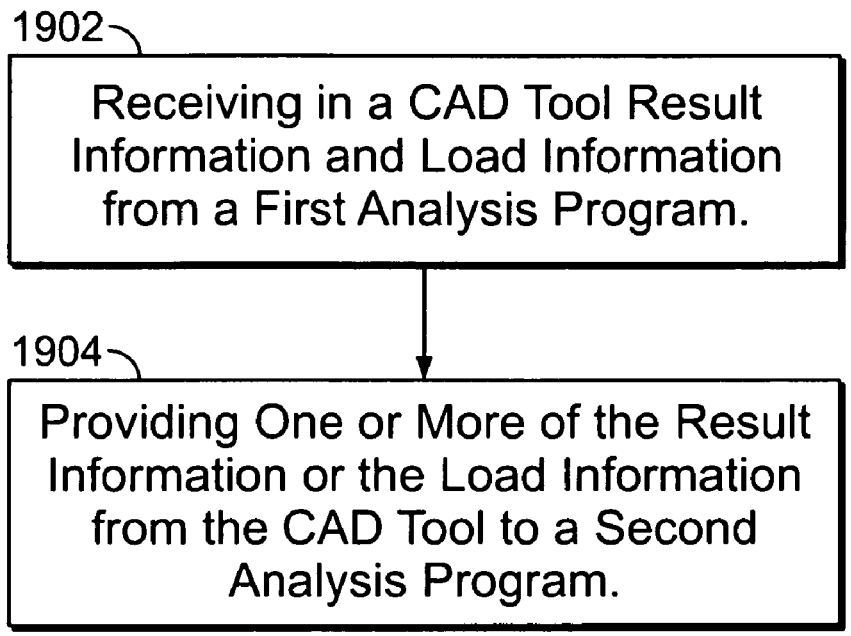
FIG. 19 is a flow diagram illustrating transference of information between analysis programs and a CAD tool.

FIG. 19 is a flow diagram illustrating transference of information between analysis programs and a CAD tool. A CAD tool (e.g., 1700) receives result information and load information from an analysis program (e.g., 1704, step 1902). In one implementation, the information can be transferred through use of an SPI (1822, 1824, 1826) from an analysis program to the CAD tool 1700 and stored in the CAD model 1702. The result information can be determined by performing an analysis of a plurality of physical elements in a CAD model, for example and as described above. One or more of the result information or the load information from the CAD tool is provided to a second analysis program (e.g., 1708, step 1904). In one implementation, the information is transferred from the CAD model 1702 to the second analysis program through use of an SPI (1822, 1824, 1826).

Figure 20:
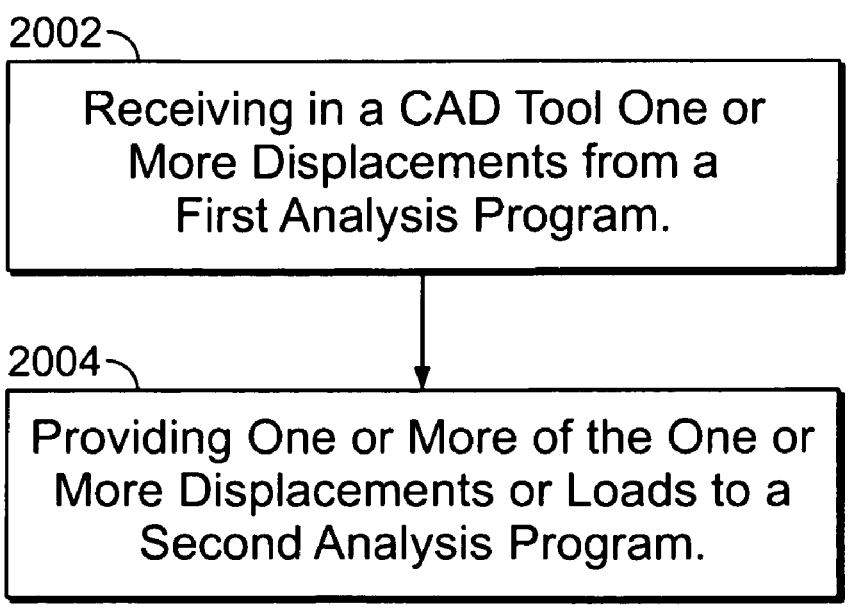
FIG. 20 is a further flow diagram illustrating transference of information between analysis programs and a CAD tool.

FIG. 20 is further flow diagram illustrating transference of information between analysis programs and a CAD tool. A CAD tool (e.g., 1700) receives one or more displacements from a first analysis program (e.g., 1704), the one or more displacements based on performing an analysis of a plurality of physical elements in a CAD model (step 2002). In one implementation, the displacements can be transferred through use of an SPI (1822, 1824, 1826) from an analysis program to the CAD tool 1700 and stored in the CAD model 1702. One or more displacements and/or one or more loads from the CAD tool are provided to a second analysis program (e.g., 1708, step 2004). In one implementation, the displacements and/or loads can be transferred from the CAD model 1702 to the second analysis program through use of an SPI (1822, 1824, 1826).

The invention and all of the functional operations described in this specification can be implemented in digital electronic circuitry, or in computer software, firmware, or hardware, including the structural means disclosed in this specification and structural equivalents thereof, or in combinations of them. The invention can be implemented as one or more computer program products, i.e., one or more computer programs tangibly embodied in an information carrier, e.g., in a machine readable storage device or in a propagated signal, for execution by, or to control the operation of, data processing apparatus, e.g., a programmable processor, a computer, or multiple computers.

A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the invention, can be performed by one or more programmable processors executing one or more computer programs to perform functions of the invention by operating on input data and generating output. The processes and logic flows can also be performed by, and apparatus of the invention can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The invention can be implemented in a computing system that includes a back end component (e.g., a data server), a middleware component (e.g., an application server), or a front end component (e.g., a client computer having a graphical user interface or a Web browser through which a user can interact with an implementation of the invention), or any combination of such back end, middleware, and front end components. The components of the system can be interconnected by any form or medium of digital data communication, e.g., a communication network. Examples of communication networks include a local area network ("LAN") and a wide area network ("WAN"), e.g., the Internet. The computing system can include clients and servers. A client and server are generally remote from each other and typically interact through a communication network. The relationship of client and server arises by virtue of computer programs running on the respective computers and having a client-server relationship to each other.

The invention has been described in terms of particular embodiments, but other embodiments can be implemented and are within the scope of the following claims. For example, the operations of the invention can be performed in a different order and still achieve desirable results. In certain implementations, multitasking and parallel processing may be preferable. Other embodiments are within the scope of the following claims

What is claimed is:

1. A computer implemented method, comprising:
receiving user input to create a physical element in a physical representation of elements that is stored in a computer aided design (CAD) model;
in response to receiving, generating the physical element in the physical representation of elements, and generating a corresponding analytical element in an analytical representation of elements that is stored in the CAD model;
providing the analytical representation to a first analysis program for application of one or more simulated loads to the analytical representation; and
receiving from the first analysis program (1) one or more displacements, wherein the one or more displacements each represent one or more changes to a size or a location of the analytical element in the analytical representation of elements as a result of the application of one or more simulated loads to the analytical representation by the first analysis program, and (2) load information specifying the simulated loads applied by the first analysis program;
modifying the analytical representation of elements that is stored in the CAD model based on the received displacements and storing the modified analytical representation of elements as the analytical representation of elements in the CAD model;
storing in the CAD model the received load information specifying the simulated loads applied by the first analysis program;
providing the modified analytical representation that is stored in the CAD model to a second analysis program receiving from the second analysis program second load information specifying simulated loads applied by the second analysis program; and
storing in the CAD model the second load information specifying the simulated loads applied by the second analysis program so that the CAD model includes a history of loads applied by the first and second analysis programs.

2. The method of claim 1, wherein the physical element represents a physical element of a structure represented by the CAD model.

3. The method of claim 1, wherein the analytical element is a simplified version of the physical element.

4. The method of claim 1, wherein the analytical element is a line or a planar surface.

5. The method of claim 4, wherein the analytical element is at least partially coincident with the physical element.

6. The method of claim 1, further comprising connecting the analytical element to another analytical element in the analytical representation to form a wire frame representation of the physical representation.

7. The method of claim 1, further comprising receiving user input modifying the analytical element and updating the corresponding physical element based on the modified analytical element.

8. The method of claim 1, further comprising storing in the CAD model the received displacements.

9. The method of claim 1,
receiving from the analysis program bending moments resulting from the application of one or more simulated loads to the analytical representation by the first analysis program, storing in the CAD model the received bending moments.

10. A computer program product tangibly embodied in a computer-readable storage device and comprising instructions that when executed by a processor perform operations comprising:
receiving user input to create a physical element in a physical representation of elements that is stored in a computer aided design (CAD) model;
in response to receiving, generating the physical element in the physical representation of elements, and generating a corresponding analytical element in an analytical representation of elements that is stored in the CAD model;
providing the analytical representation to a first analysis program for application of one or more simulated loads to the analytical representation; and
receiving from the first analysis program (1) one or more displacements, wherein the one or more displacements each represent one or more changes to a size or a location of the analytical element in the analytical representation of elements as a result of the application of one or more simulated loads to the analytical representation by the first analysis program, and (2) load information specifying the simulated loads applied by the first analysis program;

modifying the analytical representation of elements that is stored in the CAD model based on the received displacements and storing the modified analytical representation of elements as the analytical representation of elements in the CAD model;

storing in the CAD model the received load information specifying the simulated loads applied by the first analysis program;

providing the modified analytical representation that is stored in the CAD model to a second analysis program receiving from the second analysis program second load information specifying simulated loads applied by the second analysis program; and storing in the CAD model the second load information specifying the simulated loads applied by the second analysis program so that the CAD model includes a history of loads applied by the first and second analysis programs.

11. The program product of claim 10, wherein the physical element represents a physical element of a structure represented by the CAD model.

12. The program product of claim 10, wherein the analytical element is a simplified version of the physical element.

13. The program product of claim 10, wherein the analytical element is a line or a planar surface.

14. The program product of claim 13, wherein the analytical element is at least partially coincident with the physical element.

15. The program product of claim 10, further comprising receiving user input modifying the analytical element and not updating the corresponding physical element based on the modified analytical element.

16. The computer program product of claim 10, wherein the operations further comprise storing in the CAD model the received displacements.

17. The computer program product of claim 10, wherein the operations further comprise receiving from the analysis program bending moments resulting from the application of one or more simulated loads to the analytical representation by the first analysis program, storing in the CAD model the received bending moments.

18. A system comprising:
a computer readable storage device including instructions; and
one or more processors configured to execute the instructions to perform operations comprising:
receiving user input to create a physical element in a physical representation of elements that is stored in a computer aided design (CAD) model;

in response to receiving, generating the physical element in the physical representation of elements, and generating a corresponding analytical element in an analytical representation of elements that is stored in the CAD model;

providing the analytical representation to a first analysis program for application of one or more simulated loads to the analytical representation; and receiving from the first analysis program (1) one or more displacements, wherein the one or more displacements each represent one or more changes to a size or a location of the analytical element in the analytical representation of elements as a result of the application of one or more simulated loads to the analytical representation by the first analysis program, and (2) load information specifying the simulated loads applied by the first analysis program;

modifying the analytical representation of elements that is stored in the CAD model based on the received displacements and storing the modified analytical representation of elements as the analytical representation of elements in the CAD model;

storing in the CAD model the received load information specifying the simulated loads applied by the first analysis program;

providing the modified analytical representation that is stored in the CAD model to a second analysis program receiving from the second analysis program second load information specifying simulated loads applied by the second analysis program; and storing in the CAD model the second load information specifying the simulated loads applied by the second analysis program so that the CAD model includes a history of loads applied by the first and second analysis programs.

19. The system of claim 18, wherein the operations further comprise storing in the CAD model the received displacements.

20. The system of claim 18, wherein the operations further comprise receiving from the analysis program bending moments resulting from the application of one or more simulated loads to the analytical representation by the first analysis program, storing in the CAD model the received bending moments.

* * * * *

UNITED STATES PATENT AND TRADEMARK OFFICE
CERTIFICATE OF CORRECTION

PATENT NO.        : 7,788,068 B2                                                Page 1 of 1
APPLICATION NO.   : 11/345436
DATED             : August 31, 2010
INVENTOR(S)       : Nicolas Mangon It is certified that error appears in the above-identified patent and that said Letters Patent is hereby corrected as shown below:

Title Page, Item (56)
Column 2, line 2, in Other Publications, delete "Designvol. 36, Issue 4, ," and insert -- Design vol. 36, Issue 4, --, therefore.

Signed and Sealed this

Sixteenth Day of November, 2010

David J. Kappos
*Director of the United States Patent and Trademark Office*